United States Patent
Maca

(10) Patent No.: US 9,154,237 B2
(45) Date of Patent: Oct. 6, 2015

(54) MULTIPATH INTERFERENCE CANCELLATION THROUGH CEPSTRUM ANALYSIS

(71) Applicant: Andrew LLC, Hickory, NC (US)

(72) Inventor: Gregory Allan Maca, Lynchburg, VA (US)

(73) Assignee: CommScope Technologies LLC, Hickory, NC (US)

(*) Notice: Subject to any disclaimer, the term of this patent is extended or adjusted under 35 U.S.C. 154(b) by 295 days.

(21) Appl. No.: 13/796,842

(22) Filed: Mar. 12, 2013

(65) Prior Publication Data

US 2013/0189921 A1   Jul. 25, 2013

Related U.S. Application Data

(63) Continuation of application No. PCT/US2011/051753, filed on Sep. 15, 2011.

(60) Provisional application No. 61/385,086, filed on Sep. 21, 2010.

(51) Int. Cl.
*H04B 15/00* (2006.01)
*H03H 17/02* (2006.01)
*H04B 1/711* (2011.01)

(52) U.S. Cl.
CPC ........... *H04B 15/00* (2013.01); *H03H 17/0216* (2013.01); *H04B 1/711* (2013.01)

(58) Field of Classification Search
CPC ................................ H04B 15/02; H04B 15/00
USPC ........ 455/9, 7, 11.1, 18, 24, 501, 63.1, 67.13, 455/67.11; 708/323, 403
See application file for complete search history.

(56) References Cited

U.S. PATENT DOCUMENTS

| 8,341,202 | B2 | 12/2012 | Wu et al. | |
|---|---|---|---|---|
| 2005/0190822 | A1* | 9/2005 | Fujii et al. | 375/211 |
| 2008/0176513 | A1* | 7/2008 | Braithwaite et al. | 455/24 |
| 2009/0164542 | A1* | 6/2009 | Wu et al. | 708/319 |
| 2011/0249708 | A1* | 10/2011 | Maca | 375/213 |

OTHER PUBLICATIONS

Eleven pages; International Search Report and Written Opinion mailed Dec. 15, 2011; PCT/US2011/051753.

(Continued)

*Primary Examiner* — John J Lee
(74) *Attorney, Agent, or Firm* — Wood, Heron & Evans, LLP

(57) ABSTRACT

A method and apparatus of mitigating multipath coupling interference in a wireless repeater system 10 includes measuring an error signal E(z) in a signal path of the repeater which contains the desired communication signals and the multipath coupling interference and determining a cepstrum $c_{ee}[n]$ of the error signal E(z), wherein the cepstrum $c_{ee}[n]$ is reflective of the open-loop gain G(z) of the system. The method further includes extracting the impulse response of the open-loop gain G(z) from the cepstrum $c_{ee}[n]$ of the error signal E(z), calculating a plurality of cancellation filter coefficients using the extracted impulse response, and adaptively applying the plurality of filter coefficients to an adjustable filter to generate the cancellation signal necessary to mitigate the multipath coupling interference.

20 Claims, 7 Drawing Sheets

(56) References Cited

OTHER PUBLICATIONS

Twenty-Eight pages; A.V. Oppenheim, et al.; "Nonlinear Filtering of Multiplied and Convolved Signals"; Proceedings of the IEEE; IEEE; New York, US; vol. 56, No. 8; Aug. 1, 1968; pp. 1264-1291; XP000946572; ISSN: 0018-09219.

Fifteen pages; R. Kemerait, et al.; "Signal Detection and Extraction by Cepstrum Techniques"; IEEE Transactions on Information Theory; vol. 18, No. 6; Nov. 1, 1972; pp. 745-759; XP55014371; ISSN: 0018-9448.

Ten pages; M.A. Jack, et al.; "Waveform Detection Classification With Saw Cepstrum Analysis", IEEE Transactions on Aerospace and Electronic Systems; IEEE Service Center; Piscataway, NJ, US; vol. AES-10, No. 6; Nov. 1, 1977; pp. 610-619; XP011166336; ISSN: 0018-9251.

* cited by examiner

MULTIPATH INTERFERENCE CANCELLATION THROUGH CEPSTRUM ANALYSIS

CROSS-REFERENCE TO RELATED APPLICATIONS

This application is a continuation of International PCT Application No. PCT/US2011/051753, filed Sep. 15, 2011, entitled "MULTIPATH INTERFERENCE CANCELLATION THROUGH CEPSTRUM ANALYSIS", which claims priority to and the filing benefit of U.S. Provisional Patent Application Ser. No. 61/385,086 to Gregory Allan Maca filed on Sep. 21, 2010 and entitled "MULTIPATH INTERFERENCE CANCELLATION THROUGH CEPSTRUM ANALYSIS", which applications are incorporated by reference herein in their entireties.

FIELD OF THE INVENTION

The present invention relates to communication systems, such as repeaters and distributed antenna systems generally as well as, more specifically, signal processing for cancellation of multipath interference in such communication systems.

BACKGROUND OF THE INVENTION

Repeaters, distributed antenna systems, and similar systems are communication systems that are used to extend wireless signal coverage into areas where the RF signal penetration from base transceiver stations (BTS) is often limited or absent. For example, an overall wireless communication system may consist of a plurality of base transceiver stations (BTS) or base stations that communicate with each other and with user equipment, such as cellular phones, to provide a defined coverage area. In such coverage areas, there are often smaller geographical areas that have very low signal coverage, as provided by one or more of the base stations. Those areas, for example, might be inside buildings, in tunnels, in shadowed areas that are behind mountains or other obstructions, and in underground train systems, as well as various other isolated areas. Rather than simply implementing another costly and large base station to provide coverage in such low signal areas, repeaters and distributed antenna systems are often utilized.

One particular issue to be addressed within a repeater is the feedback signal that comes directly from the coverage antenna back to the donor antenna (or vice-versa for the uplink traffic). Because the feedback signal in an on-frequency repeater system is generally the same frequency as the input signal, it is considered co-channel interference, and cannot be removed by conventional filtering techniques. The feedback path can occur via a direct path, a path directly from the transmit antenna to the receive antenna, or a reflected path, a path where the signal is reflected off one or more object before being received. The direct path and the reflected paths together are called multipath coupling interference, or more simply multipath interference. Under specific conditions, the components of the multipath signals are amplified upon retransmission, overwhelming the desired signal or leading to system oscillation or other system instability.

To remove the multipath signals without corrupting the desired uplink or downlink signals, the multipath signals must be subtracted from any received signal or input signals so as to only repeat the desired signals.

It would therefore be desirable for the communication system or a portion thereof to mitigate such multipath interference to prevent the retransmission thereof.

SUMMARY OF THE INVENTION

Embodiments of the inventions are directed to a method and apparatus for mitigating multipath coupling interference in a wireless repeater system including measuring an error signal in a signal path of the repeater which contains the desired communication signals, noise and the multipath coupling interference and computing the power spectrum of the measured error signal. The cepstrum, as determined from the power spectrum of the error signal, is reflective of the open-loop gain of the system. In one embodiment, the impulse response of the open-loop gain is extracted from the cepstrum of the error signal and a plurality of cancellation filter coefficients are calculated using the extracted impulse response. The filter coefficients are then adaptively applied to an adjustable filter to generate the cancellation signal necessary to mitigate the multipath coupling interference. In an alternative embodiment, the impulse response of the open-loop gain is extracted from the cepstrum of the error signal and the open-loop gain is determined. The open-loop gain is deconvolved with the channel filter response and a plurality of cancellation filter coefficients are calculated. The filter coefficients are then adaptively applied to an adjustable filter to generate the cancellation signal necessary to mitigate the multipath coupling interference.

These and other advantages will be apparent in light of the following figures and detailed description.

BRIEF DESCRIPTION OF THE DRAWINGS

The accompanying drawings, which are incorporated in and constitute a part of this specification, illustrate embodiments of the invention and, together with a general description of the invention given above and the detailed description of the embodiments given below, serve to explain the principles of the invention.

It should be understood that the appended drawings are not necessarily to scale, presenting a somewhat simplified representation of various features illustrative of the basic principles of embodiments of the invention. The specific design features of embodiments of the invention as disclosed herein, including, for example, specific dimensions, orientations, locations, and shapes of various illustrated components, as well as specific sequences of operations (e.g., including concurrent and/or sequential operations), will be determined in part by the particular intended application and use environment. Certain features of the illustrated embodiments may have been enlarged or distorted relative to others to facilitate visualization and clear understanding.

DETAILED DESCRIPTION

Figure 1:
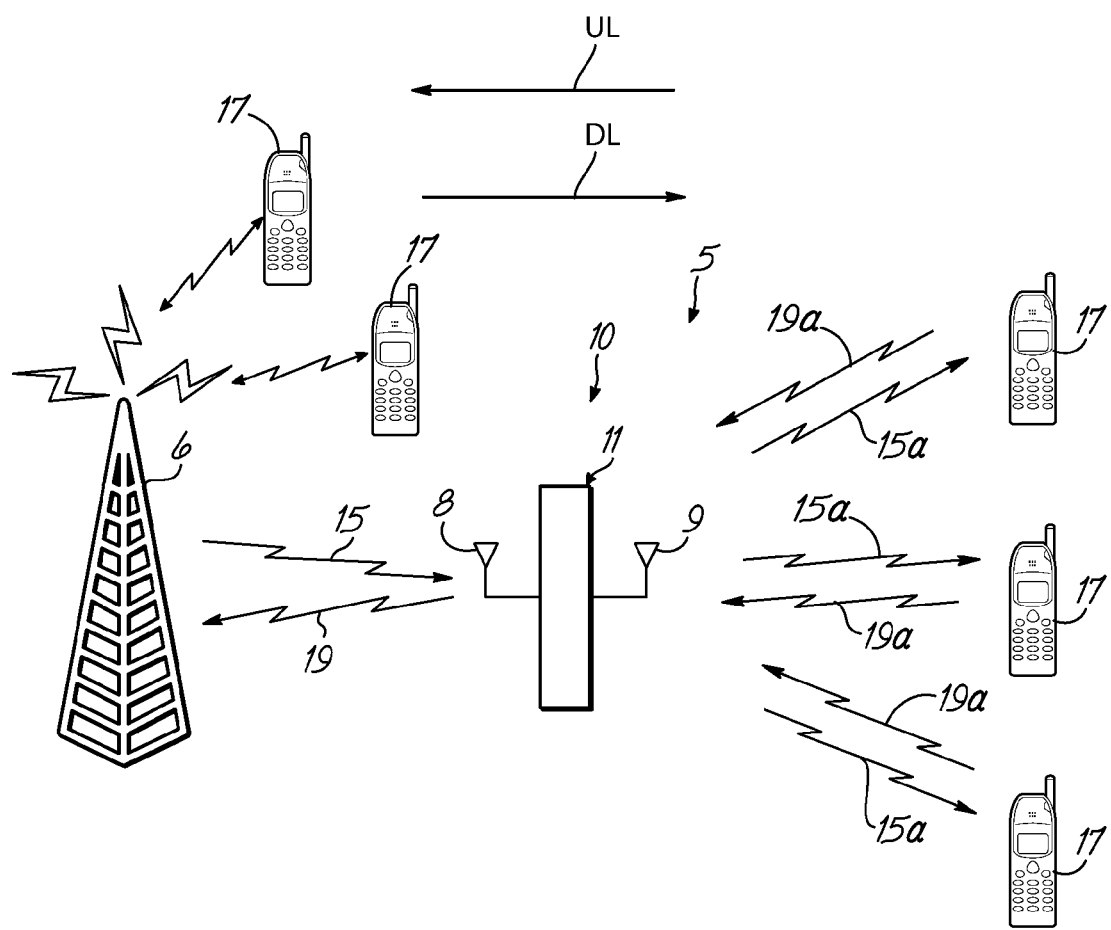
FIG. 1 illustrates a signal repeating system for use in a wireless communication system consistent with embodiments of the invention.

Referring to FIG. 1, a wireless communication system 5 for implementing embodiments of the invention is shown. Wireless communication system 5 might include a base station or tower 6 or other signal source, that communicates with a signal repeating system or repeater 10 having one or more donor antennas 8, one or more coverage antennas 9, and processing electronics 11 that are positioned between the antennas to process and amplify the repeated signal. Accordingly, downlink (DL) wireless signals 15 are received by the donor antenna 8 of the repeater, and are then repeated through the coverage antenna 9 as downlink signals 15a. The downlink signals 15a are received by one or more wireless communication devices or User Equipment (UE) devices 17, such as cellular phones. Similarly, in an uplink (UL) direction, as indicated by reference numerals 19 and 19a, the wireless devices 17 communicates signals back to the coverage antenna and the repeated signal 19 is then provided as an uplink signal back to the base station 6. As would be readily understood by a person of ordinary skill in the art, such signal repeating systems 10 can take many different forms. For example, the system 10 might be in the form of a traditional repeater device wherein the electronics and/or antennas are incorporated with a single housing and in close proximity to each other or might be in the form of a distributed antenna system (DAS) where the donor antenna is coupled with a master unit that is then connected to a plurality of remote coverage antenna units over suitable signal links, such as cable or fiber links.

Figure 2:
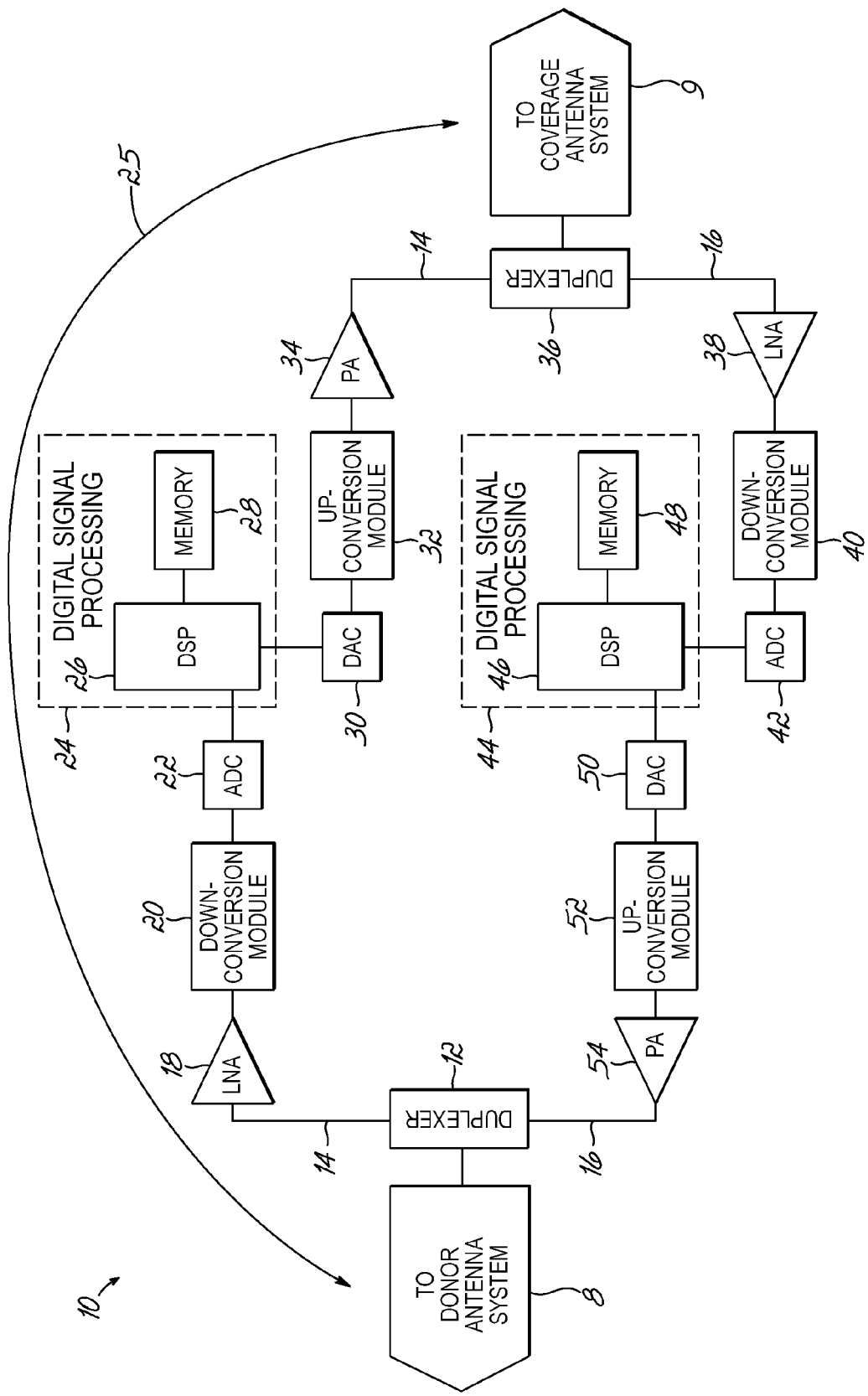
FIG. 2 is a circuit block diagram of one embodiment of the invention.

Turning to FIG. 2, wherein like numbers denote like parts throughout the several views, a circuit block diagram of an exemplary signal repeating system, such as repeater 10, is illustrated for use in a wireless communication system consistent with embodiments of the invention. Specifically, the repeater 10 is configured to facilitate communications between one or more base stations and one or more user equipment devices in the wireless communication system, as shown in FIG. 1. The repeater is thus in communication with one or more donor antennas 8 and includes a downlink path 14 and an uplink path 16. At the donor antenna 8, the uplink and downlink paths are coupled together through a suitable duplexer device or circuit 12. The repeater 10 might be coupled to the donor antennas 8 directly or through a crossband coupler.

As illustrated in FIG. 2, the downlink path 14 of the repeater 10 includes a low-noise amplifier 18 (illustrated as "LNA" 18) as well as a frequency down-conversion module 20. The down-conversion module 20 includes appropriate mixers, amplifiers, and filters to perform frequency down conversion, such as down conversion from an RF signal to an intermediate frequency (IF) signal. Module 20 is in communication with an A/D converter 22. In turn, the A/D converter 22 is in communication with digital signal processing circuitry 24. The digital signal processing circuitry 24 processes the input signals to the signal repeating system and determines and provides an echo-cancellation filter arrangement for realizing the features of the invention.

The digital signal processing circuitry 24 may be realized, for example, by a Digital Signal Processor (DSP), a Field-Programmable Gate Array (FPGA) and/or an Application Specific Integrated Circuit (ASIC). FIG. 2 illustrates the digital signal processing circuitry 24 as including a DSP element 26 as well as memory components 28 within the downlink path for implementing the echo cancellation filter and features of the invention. The memory 28 may contain a program code that may be executed by the DSP element 26 or other processing module and provides data that may be utilized by the DSP element 26.

Figure 6:
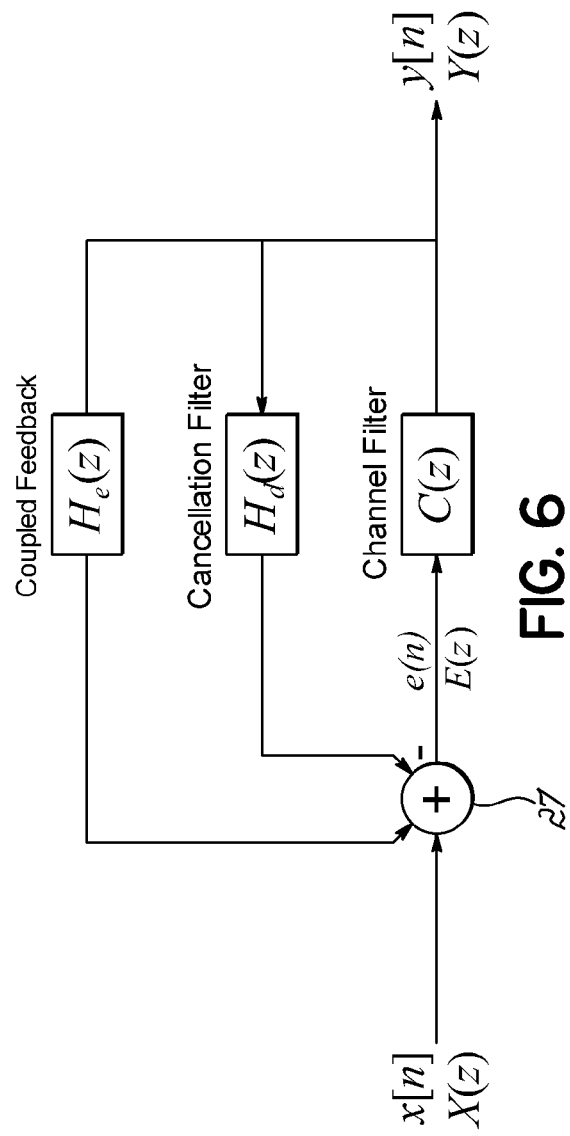
FIG. 6 is a diagram illustrating the feedback model of FIG. 5 with the addition of a cancellation filter.

The digital signal processing circuitry 24 is configured to implement digital cancellation and adaptive cancellation according to the invention for the downlink path 14 to mitigate the effects of unwanted multipath coupling 25. In the downlink path, the digital signal processing circuitry 24 implements a cancellation filter, a cancellation combiner, such as summer 27, a channel filter, and an adaptation control module in the DSP element 26, as illustrated in FIG. 6. The cancellation filter is configured with appropriate filter coefficients in accordance with the invention. The output of the DSP element 26 in the downlink path is in communication with a D/A converter 30 as well as a frequency up-conversion module 32, such as to up-convert signals to appropriate RF signals for transmission. The up-conversion module 32 is in communication with a power amplifier 34 (illustrated as "PA" 34) which is in communication with another duplexer 36. The duplexer 36 is in communication with the coverage antennas 9 to combine the uplink and downlink paths at the coverage antennas and to thus output to the coverage antennas 9 the filtered downlink signal from the donor antennas. The duplexer 36 may be in communication with the coverage antennas 9 through a crossband coupler.

As illustrated in FIG. 2, the repeater 10 includes a downlink path 14 and an uplink path 16. The uplink path 16 is similar to the downlink path. In the uplink path, an LNA 38 is in communication with the duplexer 36 that is in communication with the coverage antenna system 9. In turn, the LNA 38 is in communication with a frequency down-conversion module 40. An A/D converter 42 is in communication with the frequency down-conversion module 40 and digital signal processing circuitry 44. Digital signal processing circuitry 44 might also be realized, for example, by a Digital Signal Processor (DSP), a Field-Programmable Gate Array (FPGA), and/or an Application Specific Integrated Circuit (ASIC). FIG. 2 illustrates that the digital signal processing circuitry 44 includes a DSP element 46 as well as memory 48 for implementing an echo-cancellation filter in accordance with the invention. Similar to memory 28, the memory 48 contains program code that may be executed by the DSP element 46 or other processing module and provides data that may be utilized by the DSP element 46.

The second digital signal processing circuitry 44 is configured to implement an adaptive cancellation approach for the uplink path 16 to also mitigate the effects of unwanted multipath coupling. In the uplink path, the second digital signal processing circuitry 44, similarly to the first digital signal processing circuitry 24, implements a cancellation filter, a cancellation combiner, a channel filter, and an adaptation control module in the DSP element 46. The DSP element 46 is in communication with a D/A converter 50 which is in turn in communication with a frequency up-conversion module 52. The up-conversion module 52 is in communication with a PA 54 which is in communication with the duplexer 12.

Thus, in the downlink path 14, the repeater 10 processes a signal received from, for example, a cellular communication base station and transmits the processed signal to, for example, a mobile end user device, such as a cell phone, portable computer, and/or other device that utilizes radio-frequency ("RF") communications. In the uplink path 16, the repeater 10 processes a signal received from, for example, the mobile end user device and transmits the processed signal to, for example, the cellular communication base station. As such, embodiments of the invention using adaptive cancellation techniques as described herein may be used to cancel unwanted multipath coupling in each of the respective paths.

The adaptive cancellation approach described herein is performed by the DSP circuitry 24, 44 of the repeater 10. A suitable adaptive control module within the DSP elements 26, 46 generates finite impulse response (FIR) coefficients (also referred to as cancellation filter coefficients) that are used to dynamically adjust the operation of digital signal processing elements and circuitry 24, 44 in the respective downlink/uplink feedback paths. By dynamically adjusting the cancellation filters with the coefficients determined as described below, the adaptive cancellation process is able to mitigate the effects of unwanted multipath coupling in the respective downlink/uplink processing paths. While in the described embodiments, the downlink and uplink digital signal processing circuitry are shown as separate components, it will be understood that their functionality may be performed, for example, by one or more combined or separate DSPs and/or FPGAs and/or ASICs.

Figure 3:
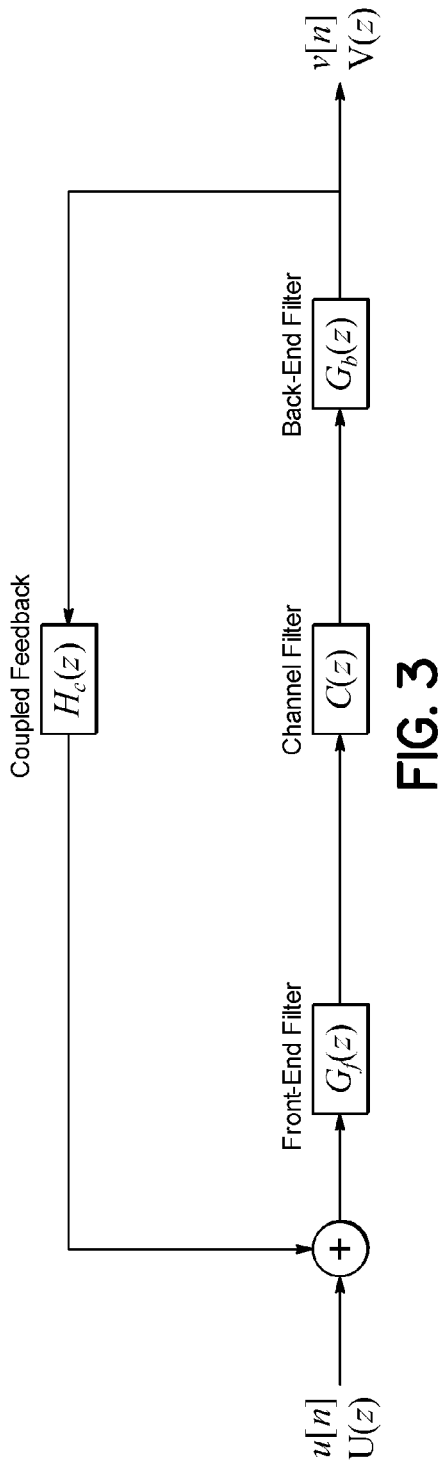
FIG. 3 is a diagram illustrating a downlink path of the communication system of FIG. 2 in a baseband equivalent form.

FIG. 3 illustrates a signal path of repeater 10 in a baseband equivalent form without multipath cancellation. Several of the filters noted herein are provide through the digital signal processing circuitry 24, 44 of the invention for implementing a feedback filter that addresses echo cancellation and undesired multipath signals. As illustrated in FIG. 3, u[n] is the discrete-time representation of the signal received at the input of one of the antennas (e.g., donor antenna 8) of the repeater 10, such as from a base station, and U(z) is the z-transform of the input signal u[n]. Likewise, v[n] is the discrete-time representation of the signal transmitted at the output of the repeater 10 (e.g., through the coverage antennas 9) and V(z) is the z-transform of signal v[n]. The filter $G_f(z)$ represents, in the z-domain, the frequency response of the analog front-end components of the repeater 10 in the paths 14, 16, which are represented, for example, in FIG. 2 as the duplexers 12, 36, the LNAs 18, 38 and the frequency down-conversion modules 20, 40 (with the A/D converters 22, 42 adding negligible or no impact to $G_f(z)$ such that it can generally be ignored). Similarly, the filter $G_b(z)$ represents, in the z-domain, the frequency response of the analog back-end components of the repeater 10 in the paths 14, 16, which are represented, for example, in FIG. 2 as the frequency up-conversion modules 32, 52 and the PAs 34, 54 (with the D/A converters 30, 50 adding negligible or no impact to $G_b(z)$ such that it can generally be ignored). The digitally implemented channel filters reflected in the filter elements 24, 44, which are represented in the z-domain as C(z), limit the bandwidth of the repeater.

As illustrated in FIG. 3, the multipath coupling or echo feedback signals 25, which couples an output of one antenna v[n] to the input u[n] of another antenna, is modeled as a FIR coupling filter in one embodiment of the invention. In the z-domain, the feedback transfer function is represented as $H_c(z)$. Such multipath coupling is typically undesired, as it may severely limit the performance of the repeater system 10, as discussed above.

Unlike the other filters noted above, the channel filter C(z) is implemented digitally and is used to limit the bandwidth of the repeater 10. In the z-domain, the channel filter C(z) can be represented as shown in Equation 1 for some integer d>0.

$$C(z)=z^{-d}(c_0+c_1z^{-1}+c_2z^{-2}+c_Lz^{-L})\qquad\text{(EQ. 1)}$$

The first term $z^{-d}$ is used to represent additional delay in the filter. The additional delay is used to account for 1) any additional delay necessary to implement the filter and 2) any additional delay necessary to separate the cepstrum of the open-loop gain and the cepstrum of the input signal (discussed below).

Figure 4:
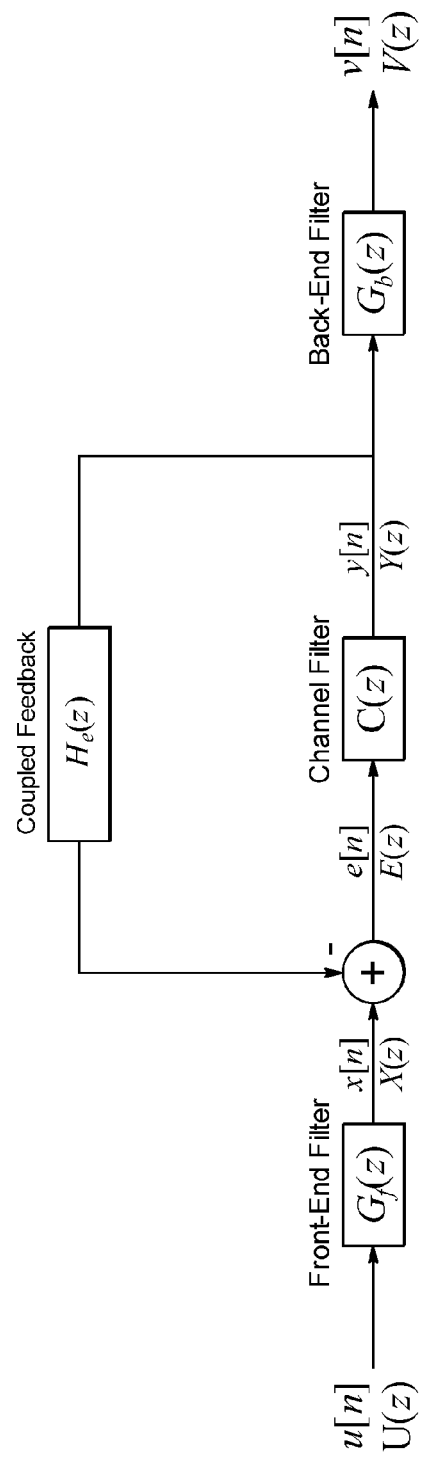
FIG. 4 is a diagram illustrating an equivalent feedback transfer function of the components of the communication system of FIG. 3.

To highlight the conditions necessary to mitigate the multipath coupling effects, i.e., substantially cancel out unwanted multipath coupling in accordance with the invention, the block diagram of FIG. 3 is rearranged into an equivalent form shown in FIG. 4. As illustrated in FIG. 4, the feedback filter $H_c(z)$ is replaced with an equivalent feedback filter $H_e(z)$, which includes the responses of the front-end filter $G_f(z)$, the coupled feedback $H_c(z)$, and the back-end filter $G_b(z)$ as shown in Equation 2.

$$H_e(z)=G_f(z)H_c(z)G_b(z)\qquad\text{(EQ. 2)}$$

Figure 5:
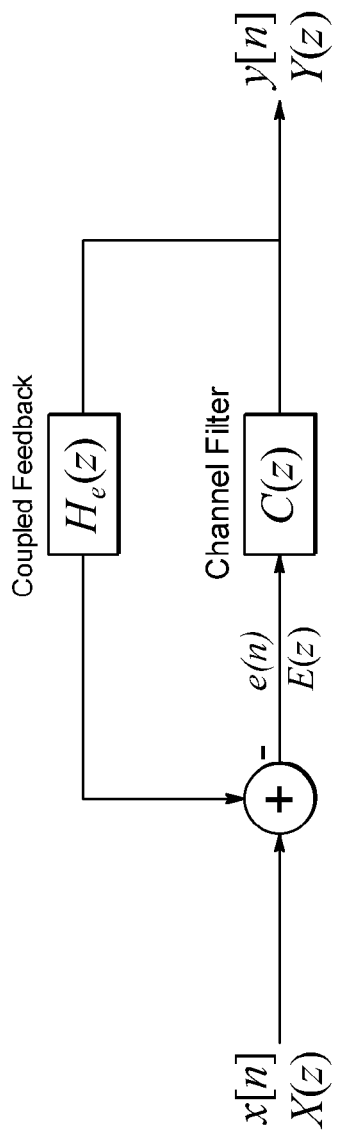
FIG. 5 is a diagram illustrating a simplified version of the transfer functions of FIG. 4.

As the desired result is to develop a method for estimating/reducing the effects of the multipath feedback $H_e(z)$, filter responses that are not within the closed loop formed thereby can be handled separately. To that end, it can be observed that the front-end filter $G_f(z)$ and the backend filter $G_b(z)$ are no longer within the closed loop. As such, the system output V(z) is not necessary as it is Y(z) that is used for feedback. Therefore, the backend filter $G_b(z)$ is of no consequence. Additionally, x[n] can be considered the input to the system since the effect of the front-end filter $G_f(z)$ can be handled as a variation of the technique described below. Therefore, in accordance with implementing the invention, a simplified system can be considered where x[n] is the input, y[n] is the output, and where $G_f(z)$ and $G_b(z)$ are omitted as illustrated in FIG. 5.

In one embodiment of the invention, a digital cancellation filter $H_d(z)$ is added in parallel to $H_e(z)$ in an effort to mitigate the multipath coupling as illustrated in FIG. 6. The filter $H_e(z)$ is nearly in parallel with the multipath coupling filter $H_c(z)$. One aspect of the described adaptive cancellation approach of the invention provides a method of estimating the filter coefficients $\{h_0, h_1, \ldots, h_M\}$, corresponding to a cancellation filter $H_d(z)$, where $H_d(z)$ can be expressed in the z-domain as shown in Equation 3.

$$H_d(z)=h_0+h_1z^{-1}+\ldots+h_Mz^{-M}\qquad\text{(EQ. 3)}$$

In FIG. 6, it can be seen that the equivalent filter $H_e(z)$ is in parallel with the cancellation filter $H_d(z)$, and therefore, when $H_d(z)=H_e(z)$ the effect of multipath coupling is removed. It should also be noted that the cancellation filter $H_d(z)$ not only needs to cancel the effects of the coupled feedback $H_c(z)$, it must also cancel the combined effects of the front-end filter $G_f(z)$ and the back-end filter $G_b(z)$.

In the adaptive algorithm that is developed as discussed below, an error signal is measured, and the error signal E(z) is used in estimating the cancellation filter coefficients $H_d(z)$.

The error signal E(z) is related to the input signal X(z) by Equation 4:

$$E(z) = X(z) \frac{1}{1 - C(z)[H_e(z) - H_d(z)]} \quad \text{(EQ. 4)}$$

The term of Equation 5, $$H(z) = (1 - C(z)[H_e(z) - H_d(z)])^{-1} \quad \text{(EQ. 5)}$$

is called the closed-loop gain of the system and similarly the term of Equation 6, $$G(z) = C(z)[H_e(z) - H_d(z)] \quad \text{(EQ. 6)}$$

is called the open-loop gain of the system. It is clear that when the open-loop gain G(z) of the system is zero, the closed-loop gain H(z)=1 and thus the error signal E(z) is equal to the input signal X(z), which indicates that the effects of the multipath coupling have been removed. A sufficient condition for the open-loop gain G(z)=0 is that $H_e(z) - H_d(z) = 0$. Therefore, with respect to the coupled feedback and the cancellation filter, when $H_e(z) = H_d(z)$ the effects of the multipath couple are mitigated.

In some embodiments, it is not necessary to estimate $H_e(z)$ directly but it is sufficient to estimate the open-loop gain G(z). The use of G(z) can be justified if we consider updating the cancellation filter $H_d(z)$ as shown Equation 7, where $\hat{H}_d(z)$ is the updated version of $H_d(z)$.

$$\hat{H}_d(z) = H_d(z) + C^{-1}(z)G(z) \quad \text{(EQ. 7)}$$

Substituting Equation 6 into Equation 7 gives Equation 8, $$H_e(z) - \hat{H}_d(z) = 0 \quad \text{(EQ. 8)}$$

which also implies that the open-loop gain is zero and is the desired result. Therefore, in accordance with the invention, instead of estimating the equivalent feedback filter $H_e(z)$, the effort then becomes the estimation of the filter coefficients of closed-loop gain G(z) which is represented in the z-domain as illustrated in Equation 9.

$$G(z) = z^{-d}(g_0 + g_1 z^{-1} + g_2 z^{-2} + g_p z^{-P}) \quad \text{(EQ. 9)}$$

Where the delay term $z^{-d}$ comes from the delay of the channel filter.

As a practical matter, Equation 7 can then be augmented as shown in Equation 10, where $0 < \mu < 1$ is a real constant.

$$\hat{H}_d(z) = H_d(z) + \mu C^{-1}(z)G(z) \quad \text{(EQ. 10)}$$

The variable $\mu$ is typically called the learning constant and may allow for the adaptation to occur more slowly. This has the effect of reducing the variability in the estimated filter coefficients.

Figure 7:
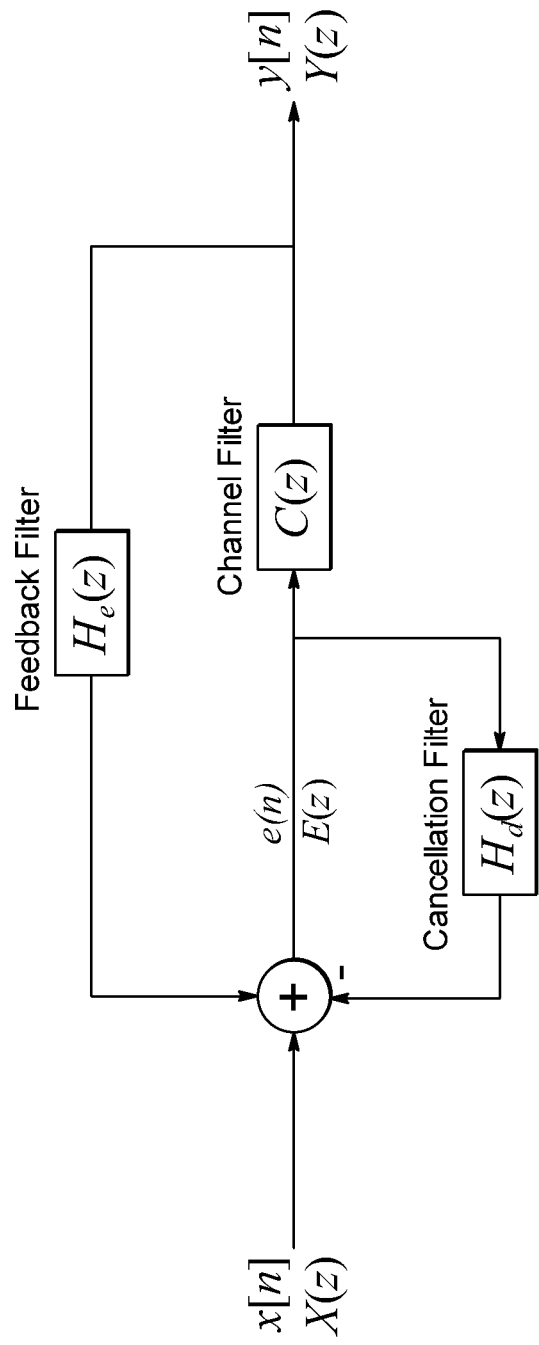
FIG. 7 is a diagram illustrating the feedback model of FIG. 5 with the addition of an alternative cancellation filter.

In an alternative embodiment of the invention, the digital cancellation filter $H_d(z)$ is added in an effort to mitigate the multipath coupling. However in this embodiment, the cancellation filter $H_d(z)$ has as its input E(z) instead of Y(z). As is shown herein, this has the effect of putting the cancellation filter in parallel with the open-loop gain G(z). FIG. 7 illustrates such an arrangement.

In this embodiment, the error signal E(z) is related to the input signal X(z) by Equation 11 as follows, $$E(z) = X(z) \frac{1}{1 - C(z)H_e(z) + H_d(z)} \quad \text{(EQ. 11)}$$

In this case, the closed-loop gain is illustrated in Equation 12, $$H(z) = (1 - C(z)H_e(z) + H_d(z))^{-1} \quad \text{(EQ. 12)}$$

and the open-loop gain is given by Equation 13, $$G(z) = C(z)H_e(z) - H_d(z). \quad \text{(EQ. 13)}$$

For the open-loop gain G(z)=0, a sufficient condition is that $H_d(z) = C(z)H_e(z)$ which is again a sufficient condition for mitigation of the multipath coupling.

Similar to the embodiment discussed above, it is not necessary to estimate $H_e(z)$ directly but it is sufficient to estimate the open-loop gain G(z). The use of G(z) can be justified if we consider updating the cancellation filter $H_d(z)$ by Equation 14, $$\hat{H}_d(z) = H_d(z) + G(z) \quad \text{(EQ. 14)}$$

where $\hat{H}_d(z)$ is the updated version of $H_d(z)$. It can then be observed per Equation 15 that, $$C(z)H_e(z) - \hat{H}_d(z) = 0 \quad \text{(EQ. 15)}$$

which implies that the open-loop gain is zero and is the desired result.

As a practical matter, the update Equation (EQ. 14) can be augmented for the same reasons as note above as $$\hat{H}_d(z) = H_d(z) + \mu G(z) \quad \text{(EQ. 16)}$$

where $0 < \mu < 1$ is a real constant.

Therefore, for the various embodiments as discussed herein in accordance with the invention, it is sufficient to estimate the filter coefficients of open-loop gain G(z) instead of estimating the equivalent feedback filter $H_e(z)$ directly.

To develop the adaptive algorithm in accordance with the invention, the error signal E(z) that is provided as input to channel filter C(z) shown in FIG. 6 and FIG. 7 is examined. The error signal E(z) contains two components: the desired signal X(z) and the feedback signal $H_e(z)Y(z)$ containing the multipath interference. Both components may be accounted for by writing the closed-loop response of E(z) as a function of the input X(z), thus leading to Equation 17.

$$E(z) = X(z) \frac{1}{1 - G(z)} \quad \text{(EQ. 17)}$$

where G(z) is the open-loop gain as defined in Equations 6 and 13.

In general, the error signal E(z) can easily be measured within the digital processing section; however, it is not possible to measure input signal X(z) without the feedback present. If X(z) could be measured, then the coefficients of the open-loop gain G(z) could be computed. Therefore, for the invention, an approach that does not require specific knowledge of X(z) is implemented. In lieu of knowing the exact input signal X(z), embodiments of the invention resort to using the spectrum and cepstrum properties of X(z).

Initially, the power spectral density (PSD) $P_{ee}(z)$ of the error signal E(z) in the z-domain can be written as illustrated in Equation 18.

$$P_{ee}(z) = P_{xx}(z)H(z)H^*\left(\frac{1}{z^*}\right) \quad \text{(EQ. 18)}$$

$$= P_{xx}(z) \frac{1}{1 - G(z)} \frac{1}{1 - G^*\left(\frac{1}{z^*}\right)}$$

When evaluated along the unit circuit, $P_{ee}(z)$ becomes the auto-PSD of $P_{ee}(f)$.

Figure 8A:
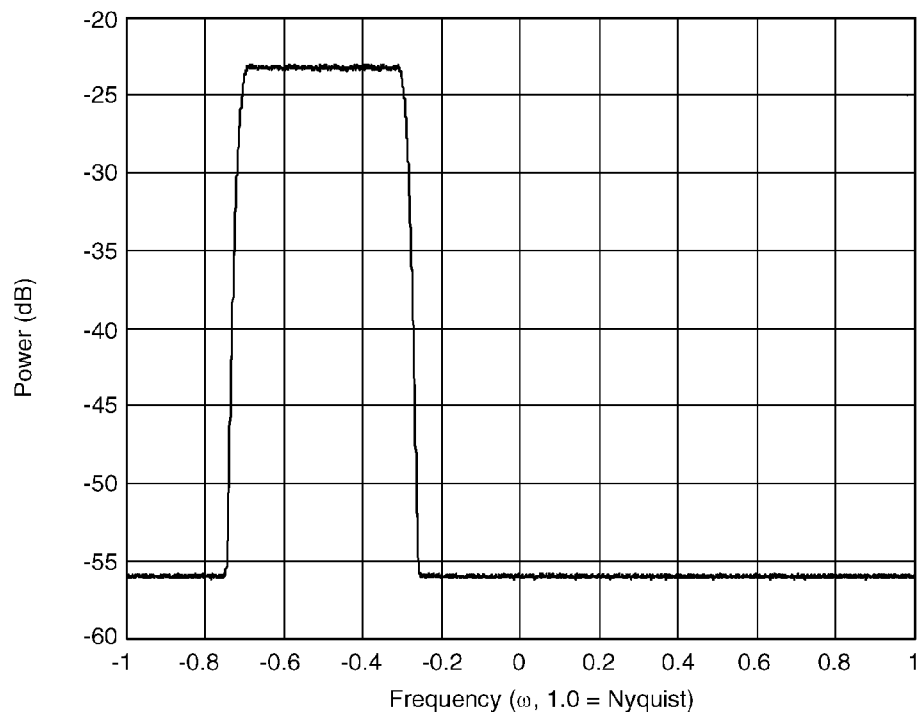
FIG. 8A is a power spectral density graph as a function of frequency of an input signal $X(z)$ to the communication system of FIG. 4.
Figure 8B:
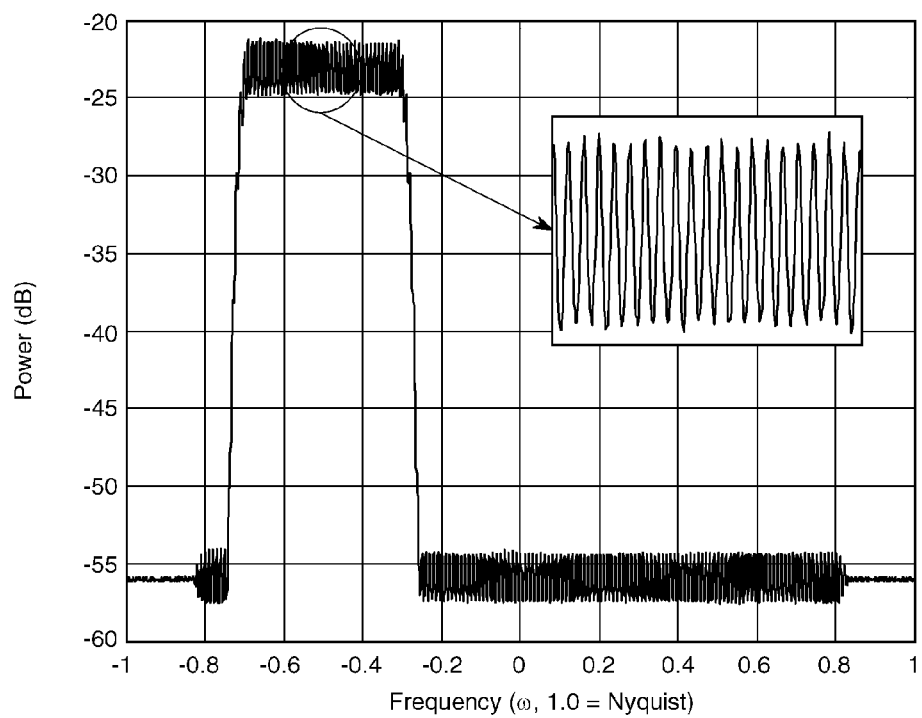
FIG. 8B is a power spectral density graph as a function of frequency of an error signal $E(z)$ of the communication system of FIG. 4.

The effect of the closed loop gain H(z) on power spectral density $P_{ee}(z)$ is to cause ripples spaced by approximately $2\pi/\tau_d$ radians, where $\tau_d$ is the number of samples of delay associated with G(z). This effect is illustrated in FIG. 8A and FIG. 8B. FIG. 8A illustrates the PSD $P_{xx}(z)$ of the input signal X(z) and FIG. 8B illustrates the PSD $P_{ee}(z)$ of the error signal E(z). The input signal has a PSD that is approximately equal to that of a wireless UMTS signal. FIG. 8B illustrates that there is a nearly periodic ripple present. As such, the PSD $P_{ee}(z)$ can be thought of as having two components: one associated with the input signal and one associated with the closed loop response. Viewing the PSD $P_{ee}(f)$ as a time-domain signal, the ripples are noticed as having a much higher frequency content than the input signal. Therefore, the two components can be separated by filtering $P_{ee}(f)$. This is a significant observation of the invention that motivates the use of a cepstrum analysis.

Equation 19 illustrates the natural logarithm of the PSD $P_{ee}(z)$, $$C_{ee}(z) = \ln(P_{ee}(z)) \quad \text{(EQ. 19)}$$
$$= \ln(P_{xx}(z)) - \ln(1 - G(z)) - \ln\left(1 - G^*\left(\frac{1}{z^*}\right)\right)$$

where $\ln(\cdot)$ is the natural logarithm. The natural logarithm is used instead of the common logarithm (base 10) to facilitate an infinite series expansion. The Taylor series expansion of the natural logarithm is shown in Equation 20.

$$\ln(1-x) = -\sum_{k=1}^{\infty} \frac{x^k}{k}, \text{ for } |x| < 1 \quad \text{(EQ. 20)}$$

As such, Equation 19 can be rewritten as shown in Equation 21, wherein $C_{xx}(z)=\ln(P_{xx}(z))$.

$$C_{ee}(z) = C_{xx}(z) + \sum_{k=1}^{\infty} \frac{G^k(z)}{k} + \sum_{k=1}^{\infty} \frac{\left(G^*\left(\frac{1}{z^*}\right)\right)^k}{k} \quad \text{(EQ. 21)}$$

In the present invention, the cepstrum of the error signal is utilized. The cepstrum (also called the real cepstrum) of the error signal E(z) is defined as $c_{ee}[n]=Z^{-1}\{C_{ee}(z)\}$ which is expanded in Equation 22, where $Z^{-1}$ is the inverse Z-transform.

$$c_{ee}[n] = c_{xx}[n] + \sum_{k=1}^{\infty} \frac{g[n]*^k g[n]}{k} + \sum_{k=1}^{\infty} \frac{g^*[-n]*^k g^*[-n]}{k} \quad \text{(EQ. 22)}$$

where the operator $*^k$ is defined to represent repeated convolution such that Equation 23 illustrates arbitrary sequences a[n] and b[n], $$a[n] *^k b[n] \equiv a[n] * \underbrace{b[n] * \ldots * b[n]}_{k-1 \text{ terms}} \quad \text{(EQ. 23)}$$

Further defining $g_k[n]=g[n]*^k g[n]$ then results in Equation 24.

$$c_{ee}[n] = c_{xx}[n] + \sum_{k=1}^{\infty} \frac{g_k[n]}{k} + \sum_{k=1}^{\infty} \frac{g_k^*[-n]}{k} \quad \text{(EQ. 24)}$$

Thus, the cepstrum $c_{ee}[n]$ of the error signal is comprised of three components: the input component $c_{xx}[n]$, the causal filter component $g_k[n]$, and the anticausal filter component $g_k[-n]$.

To analyze the first term in Equation 24 for the purposes of the invention, the cepstrum of the input signal $c_{xx}[n]$, two general properties of a cepstrum are used, namely:

1) in general, a sequence whose spectrum is smooth tends to have a cepstrum that is concentrated around zero time values, where a smooth spectrum, in this context, is a spectrum in which the slope (as a function of frequency) does not become excessively large, and 2) the magnitude of the cepstrum is invariant with respect to the center frequency of the original sequence.

Figure 9:
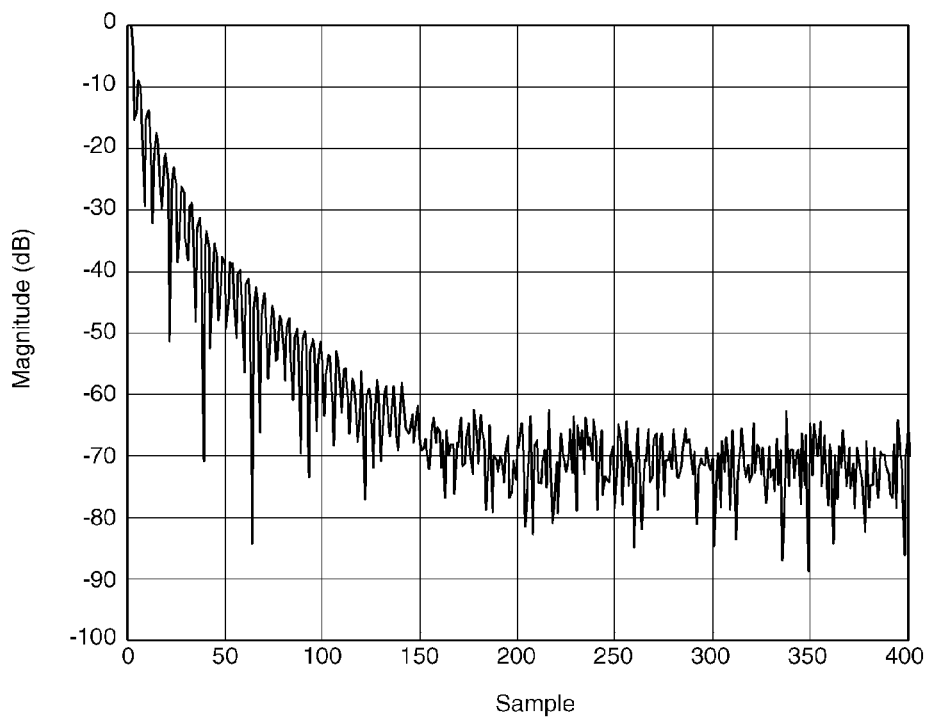
FIG. 9 is a cepstrum associated with the power spectral density of FIG. 8A.

The first cepstrum property noted above is applicable to wireless communications signals, as used in the invention. For example, the cepstrum associated with the spectrum of FIG. 8A is illustrated in FIG. 9, which illustrates that the cepstrum is concentrated at low time values. Where the two cepstrum properties noted above are combined, it would be expected that the cepstrum of the input sequence is concentrated at low time values irrespective of the center frequency.

Returning to Equation 24, it may be seen that the second and third terms thereof are functions of the impulse response of the open-loop gain G(z). Since it was assumed in Equation 9 that the open-loop gain is causal, it follows that the second term is purely causal and, correspondingly, that the third term is purely anticausal. Thus, the second and third terms do not overlap and, thus, only the causal term or second term is examined, as the anticausal term or third term is a conjugate mirror image of the causal term.

To analyze the causal term in Equation 24, the open-loop gain G(z) is first written in the z-domain, as defined in Equation 9.

$$G(z)=z^{-d}(g_0+g_1z^{-1}+g_2z^{-2}+g_Pz^{-P}) \quad \text{(EQ. 25)}$$

Next, the open-loop gain G(z) can be raised to the $k^{th}$ power as shown in Equation 26.

$$G^k(z)=z^{-kd}(g_0^{(k)}+g_1^{(k)}z^{-1}+\ldots+g_L^{(k)}z^{-L}) \quad \text{(EQ. 26)}$$

where $\{g_0^{(k)}, g_1^{(k)}, \ldots, g_L^{(k)}\}$ is the impulse response associated with $G^k(z)$ and L=kP. Thus, the causal term of Equation 24 is the sum of an infinite number of overlapping subsequences where the $k^{th}$ subsequence extends from $kd \leq n \leq k(P+d)$. At the ends of the subsequences (e.g., near n=kd and n=k(P+d)) the magnitudes of the subsequences are generally quite small. Therefore, the effect of the overlap can also be quite small. The amount of effect that the overlap has can be controlled by the amount of delay added to the open-loop gain since adding additional delay has the effect of spacing the subsequence apart.

Thus, examining each term in Equation 24, it is noted that cepstrum $c_{ee}[n] \approx g[n]$ for $d \leq n \leq P+d$ since:

1) $c_{xx}[n]$ is concentrated at low values of n and therefore $c_{xx}[n] \approx 0$ for n>d,
2) $g_k[n]=g[n]$ for k=1 and $d \leq n \leq P+d$,
3) $g_k[n] \approx 0$ for k>1 and $d \leq n \leq P+d$, and
4) $g_k[-n]=0$ for n>0.

Figure 10:
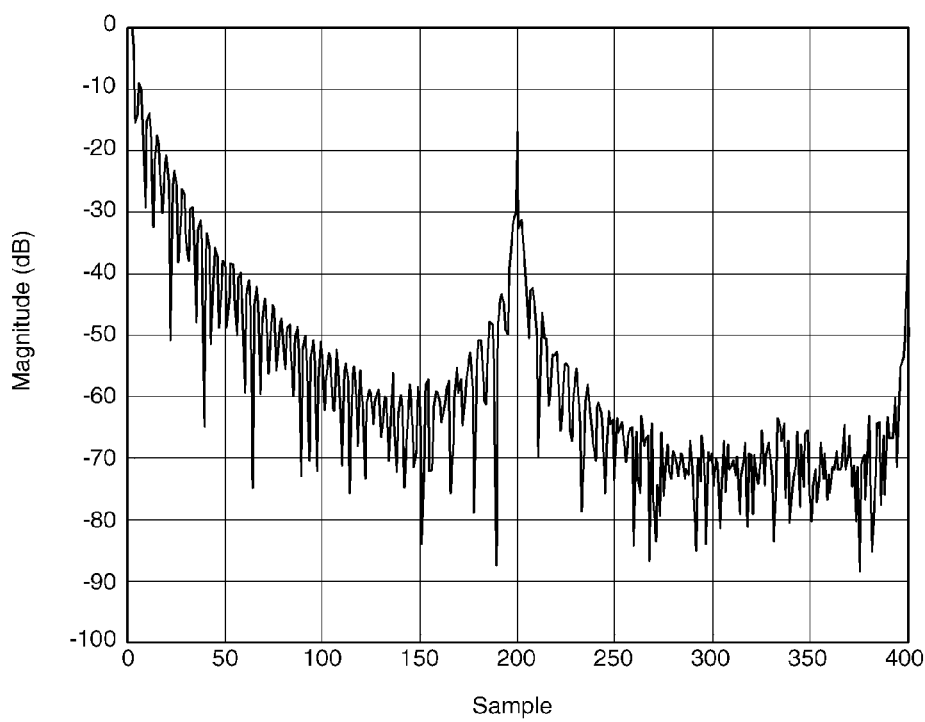
FIG. 10 is a cepstrum associated with the power spectral density of FIG. 8B.

The cepstrum $c_{ee}[n]$ of the error signal E(z) (the spectrum of which is shown in FIG. 8B) is shown in FIG. 10. This representative graph is used to illustrate that $g[n] \approx c_{ee}[n]$ for $d \le n \le P+d$. With respect to FIG. 10, several observations arise. First, the cepstrum $c_{ee}[n]$ of the error signal is approximately the same as the cepstrum $c_{xx}[n]$ of the input signal shown in FIG. 9 for low values of n<150. Second, the impulse response of the open-loop gain is visible in the range of 150<n<250. Therefore, the impulse response of the open-loop gain can be extracted directly from the cepstrum of the error signal $c_{ee}[n]$. In accordance with one aspect of the invention, a plurality of cancellation filter coefficients are then calculated using the extracted impulse response of the open-loop gain. That is, you can extract the impulse response coefficients of the open-loop gain from the cepstrum of the error signal $c_{ee}[n]$.

Once the estimated impulse response ĝ[n] of the open-loop gain is known or extracted, it can be used by the DSP circuitry to update the cancellation filter coefficients and implement an adjustable cancellation filter. For example, and as illustrated in FIG. 7, the cancellation filter coefficients can be calculated using Equation 16. Similarly, cancellation filter coefficient can be updated for the embodiment in FIG. 6 and the embodiment illustrated in FIG. 6 can also be updated by first deconvolving Ĝ(z) with the known channel response C(z) then applying Equation 10.

To utilize the technique described above in accordance with the invention, the real cepstrum must be computed or determined so that the impulse response of the open-loop gain can then be extracted. As may be appreciated, the DSP circuitry handles such computations. The first step in determining or computing the real cepstrum is to compute the power spectral density $P_{ee}(\omega)$ of the error signal e[n]. The error signal is measured in the path of the repeater and input to the DSP circuitry. The error signal can then be used to determine the cepstrum. Although many possibilities exist for estimating the power spectral density, a scaled version of a Welch Periodogram method may be used, as it can be easily implemented using a Fast Fourier Transform (FFT). The power spectral density at the radian frequency $$\omega_k = \frac{2\pi}{N}k$$

is given by the following Equation, where N is the block length, L is the overlap, K is the number of blocks to average and w[n] is a N-point window function:

$$P_{ee}(k) = \sum_{m=0}^{K-1} \left| \sum_{n=0}^{N-1} w[n]e[n+mL]e^{-j\frac{2\pi}{N}kn} \right|^2 \quad \text{(EQ. 27)}$$

Examples of the window function w[n] include the Bartlett, Blackman, Chebyshev and other window functions. The choice of window function is largely dependent on the expected spectral shape of the power spectral density of the error signal $P_{ee}(k)$. It should be noted that this disclosed version of the power spectral density estimator is a scaled version of the classical Welch Periodogram estimator. This version is used since the cepstrum techniques presented in accordance with the invention are effectively insensitive to scaling since only the time value at 0 is affected which is generally not used.

The next step in determining or computing the real cepstrum is to compute the log spectrum utilizing the power spectral density of the error signal.

$$C_{ee}(k) = \ln(P_{ee}(k)) \quad \text{(EQ. 28)}$$

It is observed that the power spectral density $P_{ee}(k)$ is real and positive, and thus no special considerations are needed in evaluating the logarithm. Additionally, since a real logarithm is utilized, a real cepstrum, as opposed to the complex cepstrum, will be computed in accordance with the invention. Finally, the real cepstrum can then be computed using the inverse Fast Fourier Transform (FFT) and the log spectrum of Equation 28.

$$c_{ee}(n) = \frac{1}{N} \sum_{k=0}^{N-1} C_{ee}(k) e^{j\frac{2\pi}{N}kn} \quad \text{(EQ. 29)}$$

With the real cepstrum computed, in accordance with the invention, the impulse response of the open-loop gain can then be extracted as $g[n] = c_{ee}[n]$ for $d \le n \le P+d$ where d is the system delay and P+1 is the length of the impulse response. Lastly, the adaptive filter coefficients for the cancellation filter can be computed or calculated using either EQ. 10 or EQ. 16, from the extracted impulse response of the open-loop gain. Once the filter coefficients are calculated, the plurality of filter coefficients are adaptively applied to an adjustable cancellation filter through the DSP circuitry in order to generate a cancellation signal. The cancellation signal is then used to mitigate the multipath coupling interference in the signal repeater system.

A person having ordinary skill in the art will recognize that the environments and illustrations of FIGS. 1-10 are not intended to limit the scope of embodiments of the invention. In particular, a wireless communication system that includes a repeater 10 and/or the repeater 10 itself may include fewer or additional components, and/or be communicably coupled to more or fewer components consistent with alternative embodiments of the invention. Indeed, a person having skill in the art will recognize that other alternative hardware and/or software environments may be used without departing from the scope of the invention. As such, other alternative hardware and software environments may be used without departing from the scope of embodiments of the invention.

The routines executed to implement with the digital signal processing circuitry of the embodiments of the invention, whether implemented as part of an operating system or a specific application, component, program, object, module or sequence of instructions executed by one or more digital signal processing components computing systems or components may be referred to as a "sequence of operations" or, more simply, "program code". The program code typically comprises one or more instructions that are resident at various times in various memory and storage devices in a repeater or computing system, and that, when read and executed by one or more processors or processing units of the repeater or computing system, cause that repeater or computing system to perform the steps necessary to execute steps, elements, and/or blocks embodying the various aspects of the invention.

While embodiments of the invention have been described in the context of fully functioning repeaters and related systems, those skilled in the art will appreciate that the various embodiments of the invention are capable of being distributed as a program product in a variety of forms, and that the invention applies equally regardless of the particular type of computer readable signal bearing media that may be used to actually carry out the invention. Examples of computer readable signal bearing media include but are not limited to physical and tangible recordable type media such as volatile and nonvolatile memory devices, floppy and other removable disks, hard disk drives, optical disks (e.g., CD-ROM's, DVD's, etc.), among others.

In addition, various program code may be identified based upon the application or software component within which it is implemented in a specific embodiment of the invention. However, it should be appreciated that any particular program and digital signal processing nomenclature is used merely for convenience, and thus the invention should not be limited to use solely in any specific application identified and/or implied by such nomenclature. Furthermore, given the typically endless number of manners in which programs run by digital signal processing circuitry may be organized into routines, procedures, methods, modules, objects, and the like, as well as the various manners in which program functionality may be allocated among various software layers that are resident within a typical computer (e.g., operating systems, libraries, APIs, applications, applets, etc.), it should be appreciated that the invention is not limited to the specific organization and allocation of program functionality described herein.

Furthermore, while embodiments of the invention has been illustrated by a description of the various embodiments and the examples, and while these embodiments have been described in considerable detail, it is not the intention of the applicants to restrict or in any way limit the scope of the appended claims to such detail. Additional advantages and modifications will readily appear to those skilled in the art. Thus, the invention in its broader aspects is therefore not limited to the specific details, representative apparatus and method, and illustrative example shown and described. Accordingly, departures may be made from such details without departing from the spirit or scope of applicants' general inventive concept.

What is claimed is:

1. A method of mitigating multipath coupling interference in a signal repeating system comprising:
   measuring an error signal in a signal path of the signal repeating system wherein the error signal contains desired communication signals and multipath coupling interference signals;
   determining a cepstrum of the error signal, wherein the cepstrum is reflective of an open-loop gain of the signal repeating system;
   extracting an impulse response of the open-loop gain from the cepstrum of the error signal;
   calculating a plurality of cancellation filter coefficients using the extracted impulse response of the open-loop gain; and
   adaptively applying the plurality of cancellation filter coefficients to an adjustable filter to generate a cancellation signal to mitigate the multipath coupling interference.

2. The method of claim 1 further comprising deconvolving the open-loop gain with the channel filter response and calculating a plurality of cancellation filter coefficients.

3. The method of claim 1, wherein determining the cepstrum of the error signal comprises:
   computing a power spectral density of the error signal;
   computing a log spectrum of the power spectral density; and
   computing the cepstrum by applying an inverse Fourier transform to the log spectrum.

4. The method of claim 3, wherein computing the power spectral density of the error signal includes applying a fast Fourier transform (FFT) to the error signal.

5. The method of claim 4, wherein computing the power spectral density of the error signal further includes implementing a scaled version of a Welch Periodogram method.

6. The method of claim 3, wherein computing the log spectrum of the power spectral density includes taking the natural log of the power spectral density.

7. The method of claim 3, wherein the inverse Fourier transform applied to the log spectrum is an inverse fast Fourier transform.

8. The method of claim 1, wherein the impulse response of the open-loop gain is extracted from a non-zero range of time values of the cepstrum of the error signal.

9. The method in claim 1, wherein the signal path includes at least one of a CDMA signal, a UMTS signal, an LTE signal, a GSM signal, a WiMax signal, or combinations thereof.

10. An apparatus comprising:
    an adjustable filter; and
    processing circuitry configured to:
      measure an error signal in a signal path of a signal repeating system which contains desired communication signals and multipath coupling interference signals;
      determine a cepstrum of the error signal that is reflective of an open-loop gain of the signal repeating system;
      extract an impulse response of the open-loop gain from the cepstrum of the error signal;
      calculate a plurality of cancellation filter coefficients using the extracted impulse response of the open-loop gain; and
      adaptively apply the plurality of cancellation filter coefficients to the adjustable filter to generate a cancellation signal to mitigate the multipath coupling interference.

11. The apparatus of claim 10, wherein the processing circuitry is further configured to deconvolve the open-loop gain with the channel filter response and calculate a plurality of cancellation filter coefficients.

12. The apparatus of claim 10, wherein the processing circuitry is further configured to determine a cepstrum that is reflective of the open-loop gain of the system by computing a power spectral density of the error signal, computing a log spectrum of the power spectral density, and computing the cepstrum by applying an inverse Fourier transform to the log spectrum.

13. The apparatus of claim 12, wherein the processing circuitry is further configured to compute the power spectral density of the error signal by applying a fast Fourier transform (FFT) to the error signal.

14. The apparatus of claim 13, wherein computing the power spectral density of the error signal includes implementing a scaled version of a Welch Periodogram method.

15. The apparatus of claim 12, wherein computing the log spectrum of the power spectral density includes taking the natural log of the power spectral density.

16. The apparatus of claim 12, wherein the inverse Fourier transform applied to the log spectrum is an inverse fast Fourier transform.

17. The apparatus of claim 10 wherein the impulse response of the open-loop gain is extracted from a non-zero range of time values of the cepstrum of the error signal.

18. The apparatus of claim 10, wherein the signal path includes at least one of a CDMA signal, a UMTS signal, an LTE signal, a GSM signal, a WiMax signal, or combinations thereof.

19. The apparatus of claim 10, wherein the apparatus is a signal repeating system.

20. The apparatus of claim 19, wherein the signal repeating system is one of a repeater or a distributed antenna system.

* * * * *